United States Patent
Yeh

(10) Patent No.: US 6,992,516 B2
(45) Date of Patent: Jan. 31, 2006

(54) PULSE DUTY CYCLE AUTOMATIC CORRECTION DEVICE AND METHOD THEREOF

(75) Inventor: Chun Wen Yeh, Taipei (TW)

(73) Assignee: Ali Corporation, Taipei (TW)

( * ) Notice: Subject to any disclaimer, the term of this patent is extended or adjusted under 35 U.S.C. 154(b) by 8 days.

(21) Appl. No.: 10/778,402

(22) Filed: Feb. 17, 2004

(65) Prior Publication Data

US 2005/0068079 A1   Mar. 31, 2005

(30) Foreign Application Priority Data

Sep. 30, 2003   (TW) .............................. 92126983 A

(51) Int. Cl.
*H03K 7/08* (2006.01)
(52) U.S. Cl. ..................................... 327/175; 327/178
(58) Field of Classification Search ........ 327/170–178, 327/276, 277, 284
See application file for complete search history.

(56) References Cited

U.S. PATENT DOCUMENTS

| 6,040,726 | A  | * | 3/2000 | Martin | 327/175 |
| 6,229,359 | B1 | * | 5/2001 | Chesavage | 327/116 |
| 6,452,432 | B2 | * | 9/2002 | Kim | 327/158 |
| 6,731,158 | B1 | * | 5/2004 | Hass | 327/537 |

* cited by examiner

*Primary Examiner*—Linh My Nguyen
(74) *Attorney, Agent, or Firm*—Birch, Stewart, Kolasch & Birch, LLP

(57) ABSTRACT

A pulse duty cycle automatic correction device has a pulse width detector for detecting the high, low level pulse widths of the input cycle pulse so as to generate high, low level signals; a comparator encoder for comparing the high, low level signals, calculating out a correction delay time, and generating a correction delay signal and an output selection signal; a delay circuit for generating a delay cycle pulse; a compensation circuit for compensating the input cycle pulse so as to generate an input compensation pulse; a logic circuit for generating two cycle pulses according to the delay cycle pulse and the input compensation pulse; and a multiplexer for receiving the two cycle pulses and the input cycle pulse, and generating the output cycle pulse with duty cycle of 50% according to the output selection signal.

9 Claims, 5 Drawing Sheets

PULSE DUTY CYCLE AUTOMATIC CORRECTION DEVICE AND METHOD THEREOF

This Nonprovisional application claims priority under 35 U.S.C. § 119(a) on patent application Ser. No. 09/2,126,983 filed in TAIWAN on Sep. 30, 2003, the entire contents of which are hereby incorporated by reference.

BACKGROUND OF THE INVENTION

1. Field of the Invention

The present invention relates to a pulse duty cycle automatic correction device and a method thereof, and more particularly, to an automatic correction device and a method thereof for stabilizing the pulse duty cycle of the cycle pulse signal to be 50%.

2. Description of the Prior Art

As electronic technology advances, various electronic devices make daily life more convenient and enjoyable, and enrich the people's life. People are more dependent on electronic devices, and it is thus important to improve the stability of the electronic devices. Generally, when transmitting and processing electronic data, a system must be operated in coordination with the specific pulses so as to correctly analyze the serial format in the data content and process the data in harmony. Therefore, when designing the output/input circuits of the electrical circuits, the stability of the work pulse duty cycle is very important.

However, due to variation in work voltage and work temperature, different driving modes, different loading effects, or improper circuit design, the work pulse duty cycle will be instable so as to badly affect data transmission and processing.

In the prior art pulse duty cycle correction device, a phase-lock loop (PLL) is operated in coordination with a reference pulse so as to stabilize the pulse duty cycle, or some control circuits are used for correcting the pulse duty cycle. However, the frequency of the mentioned reference pulse is always higher than the pulse to be adjusted, and the complicated control circuits require much more time to design and correct.

Furthermore, in the prior art, the pulse duty cycle can be corrected by changing the size of the metal oxidization semiconductor (MOS) or by applying the analog circuit design. However, this tends to cause the working point of the circuit to be out of control and to malfunction, thus requiring much more time to design the compensation circuit.

SUMMARY OF THE INVENTION

Therefore, the present invention provides a pulse duty cycle automatic correction device and a method thereof. In this way, a simple circuit can be used for adjusting the duty cycle of the output pulse, and the duty cycle can be automatically adjusted and corrected. Furthermore, the resolution of the pulse can be corrected to be as precise as tens of $10^{-12}$ second (ps).

The present invention relates to a pulse duty cycle automatic correction device and a method thereof. A pulse width detector is used for detecting the relation between the high and low level pulse widths of the input cycle pulse. According to this relation, a comparator encoder generates a correction delay signal and an output selection signal. According to the correction delay signal, the delay circuit will output a delay cycle pulse lagging behind the input cycle pulse, and then perform a logic operation on an input compensation pulse and the delay cycle pulse so as to output two kinds of cycle pulses. According to the output selection signal, a multiplexer will select how to output a stably proportional cycle pulse based on the input cycle pulse and the mentioned two kinds of cycle pulses.

BRIEF DESCRIPTION OF THE DRAWINGS

The accompanying drawings, which are incorporated in and form part of the specification in which like numerals designate like parts, illustrate preferred embodiments of the present invention and, together with the description, serve to explain the principles of the invention. In the drawings.

DETAILED DESCRIPTION OF THE PREFERRED EMBODIMENT

Figure 1:
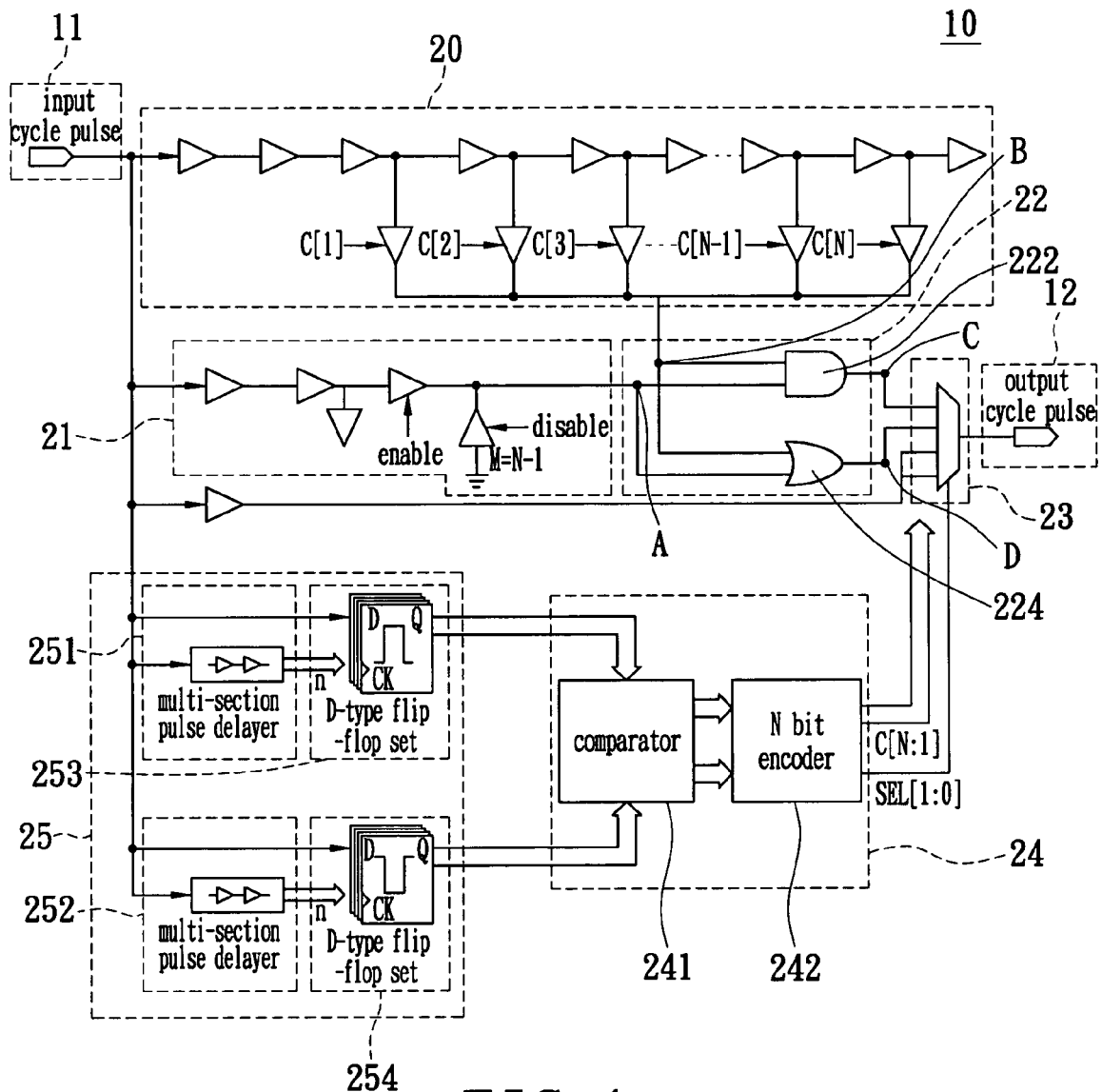
FIG. 1 is a block diagram of a pulse duty cycle automatic correction device according to the present invention.

Reference is made to FIG. 1. FIG. 1 is a block diagram of a pulse duty cycle automatic correction device 10 according to the present invention. The pulse duty cycle automatic correction device 10 will generate a proportional cycle pulse according to the input cycle pulse 11, namely, an output cycle pulse 12. The pulse duty cycle automatic correction device 10 comprises a delay circuit 20, a compensation circuit 21, a logic circuit 22, a multiplexer 23, a comparator encoder 24, and a pulse width detector 25.

The pulse width detector 25 is composed of multi-section pulse delayers 251, 252 and D-type flip-flop sets 253, 254. The multi-section pulse delayers 251, 252 are separately connected to the D-type flip-flop sets 253, 254, and each of the D-type flip-flop sets 253, 254 comprises a plurality of D-type flip-flops. The pulse width detector 25 is used for receiving the input cycle pulse 11 and separately detecting the high level pulse width (DH) and the low level pulse width (DL) of the input cycle pulse 11. Then, by using the multi-section pulse delayers and the plurality of D-type flip-flops, the high level signal (HS) and the low level signal (LS) proportional to the high level pulse width (DH) and the low level pulse width (DL) of the input cycle pulse are generated. The logic circuit 22 is composed of an AND gate circuit 222 and an OR gate circuit 224 for separately performing AND gate and OR gate operations on the input compensation pulse A and the delay cycle pulse B so as to generate an AND gate cycle pulse C and an OR gate cycle pulse D.

Figure 2:
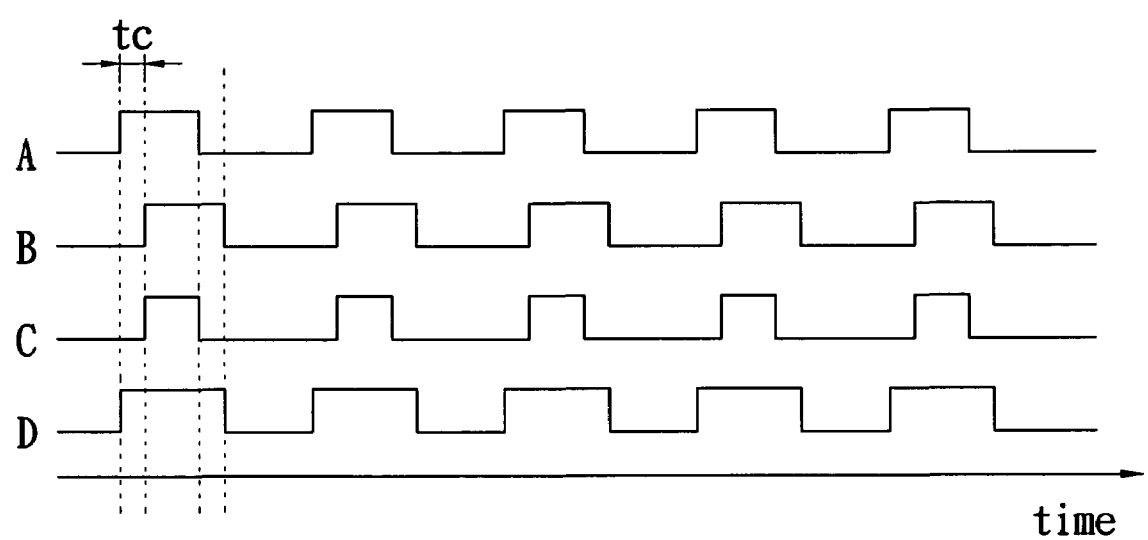
FIG. 2 is a perspective diagram of the logic operations on the input compensation pulse A and the delay cycle pulse B.

Reference is made to FIG. 2. FIG. 2 is a perspective diagram of the logic operations on the input compensation pulse A and the delay cycle pulse B. The AND gate cycle pulse C is generated by performing a logic operation of AND on the input compensation pulse A and the delay cycle pulse B. The OR gate cycle pulse D is generated by performing a logic operation of OR on the input compensation pulse A and the delay cycle pulse B.

Figure 3:
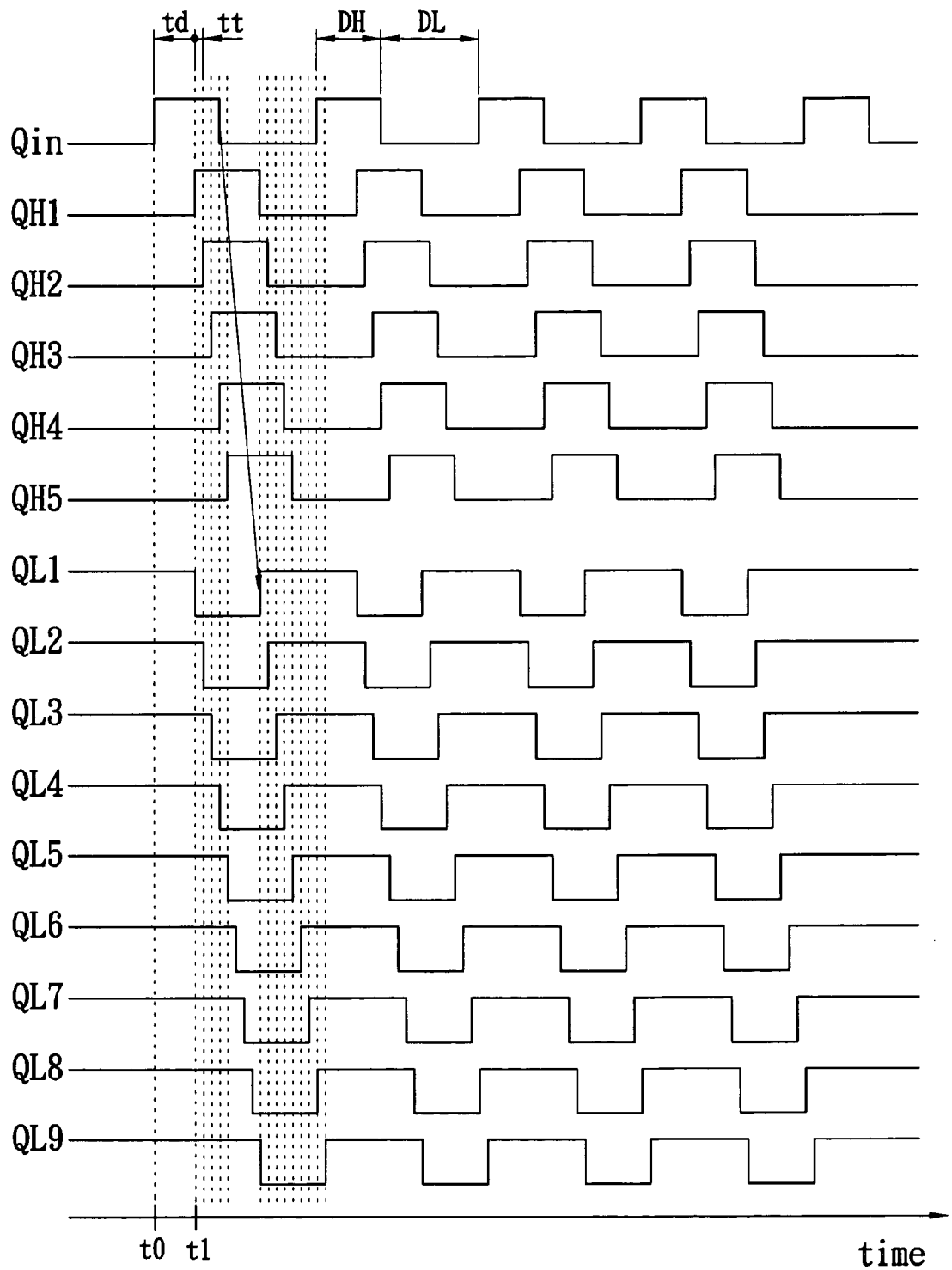
FIG. 3 shows the detection waveforms of the high level pulse width (DH) and the low level pulse width (DL)

Reference is made to FIG. 3. FIG. 3 shows the detection waveforms of the high level pulse width (DH) and the low level pulse width (DL). The cycle pulse Qin is the input cycle pulse 11, and the input cycle pulse 11 is delayed for a natural predetermined time td (t0 to t1) and then section-dividedly delayed by the multi-section pulse delayer 251 so as to obtain the cycle pulses QH1 to QH5. The input cycle pulse Qin is counted by the plurality of D-type flip-flops 253. The D-type flip-flops 253 is trigged by the cycle pulses QH1 to QH5 so as to generate the high level signal (HS) proportional to the high level pulse width (DH) of the input cycle pulse Qin. The input cycle pulse is delayed for a natural predetermined time td (t0–t1), converted, and then section-dividedly delayed by the multi-section pulse delayer 252 so as to obtain the cycle pulses QL1 to QL9. The input cycle pulse Qin is counted by the plurality of D-type flip-flops 254. The D-type flip-flops 254 is trigged by the cycle pulses QL1 to QL9 so as to generate the low level signal (LS) proportional to the low level pulse width (DL) of the input cycle pulse Qin.

As shown in FIG. 3, the predetermined unit of delay time of the multi-section pulse delayer is tt. The multi-section pulse delayer 251, 252 will section-dividedly delay the input signal, further to be counted by the plurality of D-type flip-flops 253, 254 so as to generate the high level signal (HS) and the low level signal (LS) with the unit of delay time tt.

As shown in FIG. 3, the high level signal (HS) has 5 units of delay time, and the low level signal (LS) has 9 units of delay time. The high level signal (HS) and the low level signal (LS) are operated so as to obtain a correction delay time tc.

$$tc = |HS - LS|/2 \quad (1)$$

The above formula (1) performs a ceiling operation (i.e., rounding off toward infinite plus). At the same time, the comparator 241 will compare the high level signal (HS) and the low level signal (LS). There are three statuses to be described: 1. the high level signal greater than the low level signal (HS>LS); 2. the high level signal smaller than the low level signal (HS<LS); 3. the high level signal equal to the low level signal (HS=LS). By using these three statuses, the status of the input pulse can be further detected, and based on this, the operation of the logic circuit is controlled.

As shown in FIG. 1, the mentioned correction delay time tc will be passed through the encoder 242 to be encoded so as to generate a correction delay signal C[N:1] for controlling the number of the sections of the delay time of the delay circuit to be 1 to N. The unit of the delay time of the delay circuit is equal to the unit of the delay time of the multi-section pulse delayer tt. The mentioned three statuses are encoded by the encoder 242 so as to generate an output selection signal SEL[1:0]. The selection signal SEL[1:0] is a two-bit control signal for selecting the output of the multiplexer.

The delay circuit 20 in FIG. 1 is a time delay circuit with N sections. The circuit will receive the mentioned correction delay signal C[N:1], delay the input cycle pulse for a correction delay time tc, and output a delay cycle pulse B to the logic circuit 22.

During the operation of the delay circuit 20, the inside delay unit will generate the difference delay time beyond the correction delay time tc, and therefore, the delay cycle pulse B outputted to the logic circuit 22 is incorrect, not delaying the correction delay time tc. In this way, by using the difference delay time generated by the inside delay unit during the operation of the delay circuit 20 to be the compensation of the input cycle pulse 11, the compensation circuit 21 will output an input compensation pulse A to the logic circuit 22 so as to make the delay time between the input compensation pulse A and the delay cycle pulse B be the correct correction delay time tc.

Reference is made to FIG. 1 and FIG. 2 again. The logic circuit 22 in FIG. 1 comprises an AND gate circuit 222 and an OR gate circuit 224. In practice, according to the user's requirement, the arrangement of the gates is not limited, and therefore, can be a NAND gate, a NOR gate and a NOT gate. In FIG. 2, an AND gate operation and an OR gate operation are separately performed on the input compensation pulse A and the delay cycle pulse B so as to generate an AND gate cycle pulse C of which the high level pulse width is smaller than that of the input compensation pulse A and an OR gate cycle pulse D of which the high level pulse width is greater than that of the input compensation pulse A.

Figure 4:
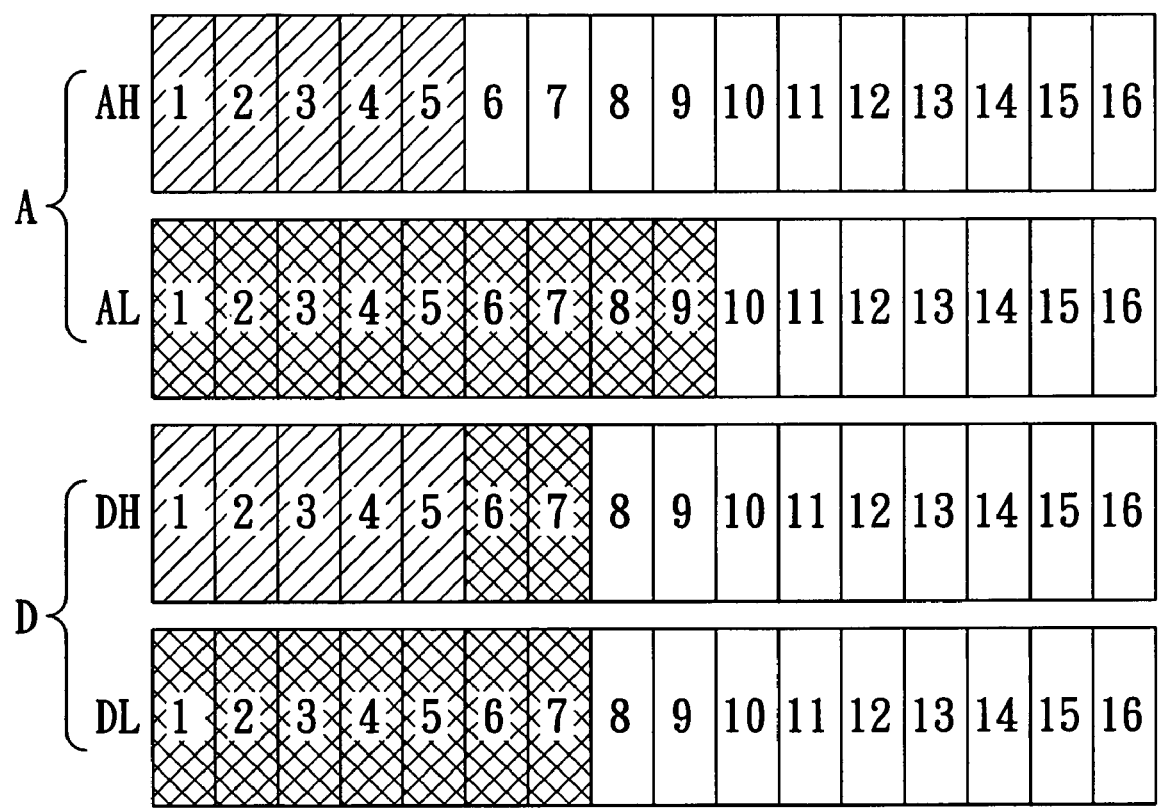
FIG. 4 shows the pulse width comparison of the mentioned input compensation pulse A and OR gate cycle pulse D.

Reference is made to FIG. 4 along with FIG. 2 and FIG. 3. FIG. 4 shows the pulse width comparison of the mentioned input compensation pulse A and OR gate cycle pulse D. The high level pulse width AH of the input compensation pulse A is increased by two units of delay time section so as to be the high level pulse width DH of the OR gate cycle pulse D, and the low level pulse width AL of the pulse A is decreased by two units of delay time section so as to be the low level pulse width DL of the OR gate cycle pulse D. In this way, the duty cycle of the pulse D will be the cycle pulse with the proportion of 50%.

Therefore, during the practice, an AND gate operation can be performed on the input compensation pulse A and the delay cycle pulse B so as to generate the AND gate cycle pulse C. This makes the duty cycle of the pulse C be the cycle pulse with the proportion of 50%. Also, an OR gate operation can be performed on the input compensation pulse A and the delay cycle pulse B so as to generate the OR gate cycle pulse D. This makes the duty cycle of the pulse D be the cycle pulse with the proportion of 50%.

The multiplexer in FIG. 1 will receive the AND gate cycle pulse C, the OR gate cycle pulse D and the input cycle pulse 11 at the same time. First, the comparator 241 will compare the high level signal (HS) and the low level signal (LS), and then the encoder 242 will encode the output selection signal SEL[1:0] for selecting the output of the multiplexer. There are three selections: 1. if the high level signal is greater than the low level signal (HS>LS), then the AND gate cycle pulse is selected; 2. if the high level signal is smaller than the low level signal (HS<LS), then the OR gate cycle pulse is selected; and 3. if the high level signal is equal to the low level signal (HS=LS), then the input cycle pulse is selected. At this time, the duty cycle of the output cycle pulse 12 of the multiplexer is the cycle pulse of 50%.

Figure 5:
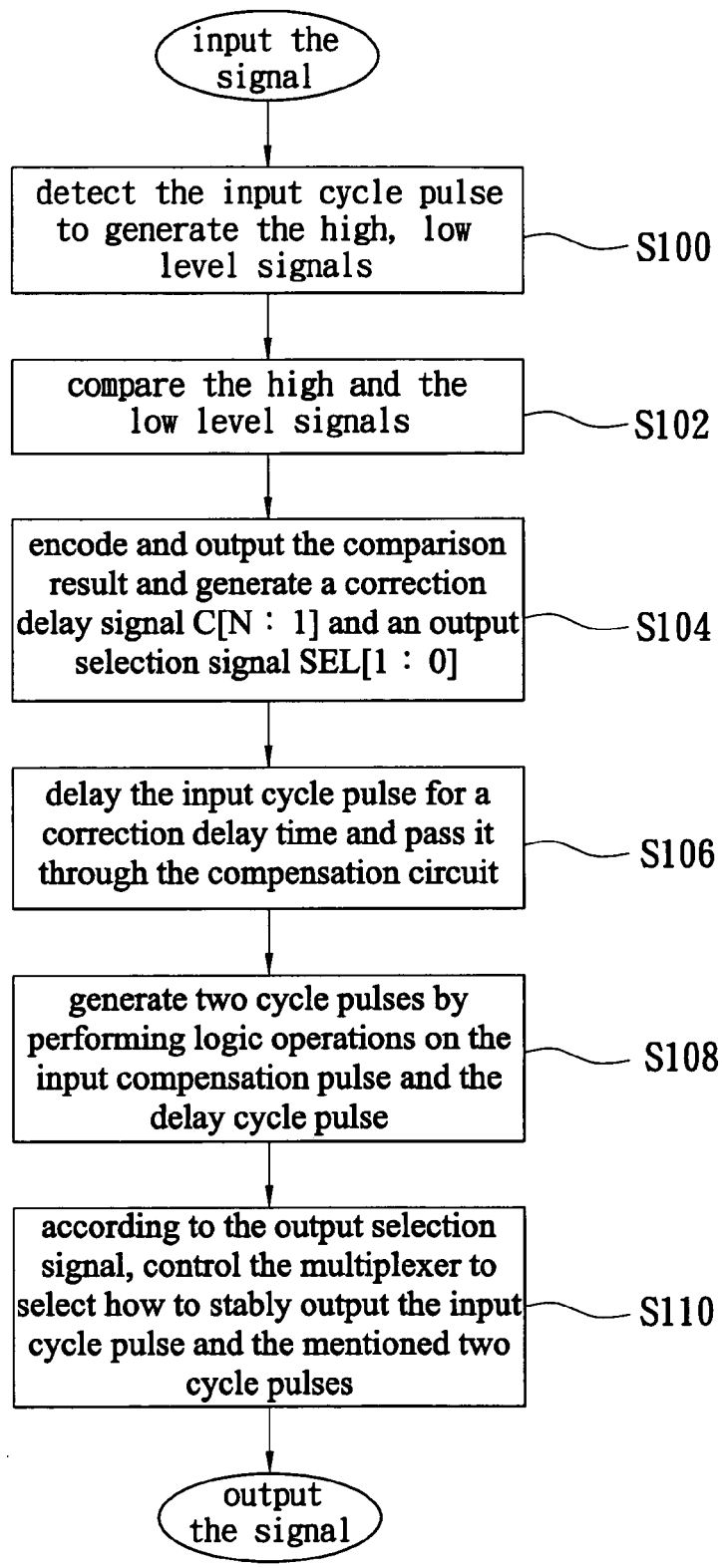
FIG. 5 is a flowchart of a pulse duty cycle automatic correction method according to the present invention.

Next, the operation process of the pulse duty cycle automatic correction method according to the present invention is described. Reference is made to FIG. 1 and FIG. 5. The method comprises the following steps: detecting the high, low level pulse widths of the input cycle pulse so as to generate the high, low level signals (S100); comparing the high, low level signals (S102); encoding and outputting the comparison result so as to generate the correction delay signal C[N:1] and the output selection signal SEL[1:0] (S104); generating a delay cycle pulse by controlling a delay circuit by the correction delay signal C[N:1] so as to delay the input cycle pulse for a correction delay time, at the same time, the input cycle pulse passing through a compensation circuit 21 for compensating the difference delay time of the delay circuit so as to generate an input compensation pulse (S106); generating two cycle pulses by performing logic operations on the input compensation pulse and the delay cycle pulse (S108); and controlling the multiplexer 23 to select how to stably output the input cycle pulse and the mentioned two cycle pulses by the output selection signal, in which the duty cycle of the output cycle pulse is stabilized to be the proportion of 50% (S110).

In the flowchart of the present invention, the input cycle pulse will first pass through the pulse width detector 25 so as to generate the high level signal (HS) and the low level signal (LS). The high level signal (HS) and the low level signal (LS) are operated, compared and encoded so as to generate a correction delay signal C[N:1] for controlling the correction delay time tc of the delay circuit 20 and an output selection signal SEL[1:0] for selecting the output of the multiplexer 23. At the same time, the input cycle pulse will pass through the delay circuit 20 and the compensation circuit 21 for separately generating the delay cycle pulse and the input compensation pulse. Then, the logic operations of AND gate and OR gate are performed on these two cycle pulses at the same time so as to generate the AND gate cycle pulse and the OR gate cycle pulse. Then, the two pulses are inputted to the multiplexer 23, and according to the mentioned output selection signal SEL[1:0], the multiplexer will select how to output a cycle pulse with stabilized duty cycle based on the two cycle pulses and the input cycle pulse.

In summary, the pulse duty cycle automatic correction device and a method thereof according to the present invention can stabilize the pulse duty cycle required by the operation of the electric circuit. The stable pulse duty cycle will not be affected by variations of the work voltage and the work temperature, and can be accomplished by using a simple circuit. The present invention can overcome the drawbacks of the prior art, including the great consumptions of time and cost on designing and modifying the complicated control circuit, and the malfunction due to the out-of-control of the working point of the analog circuit.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A pulse duty cycle automatic correction device, comprising:
    a pulse width detector for detecting an input cycle pulse so as to generate a high level signal and a low level signal;
    a comparator encoder connected to the pulse width detector for generating a correction delay signal and an output selection signal;
    a delay circuit connected to the comparator encoder for receiving the input cycle pulse so as to output a delay cycle pulse;
    a compensation circuit for compensating the input cycle pulse so as to generate an input compensation pulse according to the difference delay beyond a correction delay time generated during the operation of the delay circuit;
    a logic circuit connected to the compensation circuit and the delay circuit for generating a greater duty cycle than the cycle pulse of the input cycle pulse and a smaller duty cycle than the cycle pulse of the input cycle pulse separately according to the input compensation pulse and the delay cycle pulse; and
    a multiplexer connected to the comparator encoder and the logic circuit for receiving the input cycle pulse so as to generate a cycle pulse with a proportional duty cycle;
    wherein the correction of a pulse cycle is obtained by acquiring a delay of time unit.

2. The pulse duty cycle automatic correction device of claim 1, wherein the high level signal and the low level signal are separately proportional to a high level pulse width and a low level pulse width of the input cycle pulse.

3. The pulse duty cycle automatic correction device of claim 1, wherein the comparator encoder performs an operation on the high level signal and the low level signal so as to generate the correction delay signal.

4. The pulse duty cycle automatic correction device of claim 1, wherein the comparator encoder compares the high level signal and the low level signal so as to generate the output selection signal.

5. The pulse duty cycle automatic correction device of claim 1, wherein the delay circuit generates the delay cycle pulse according to the correction delay signal.

6. The pulse duty cycle automatic correction device of claim 1, wherein the logic circuit comprises:
    an AND gate circuit for performing a logic operation of AND on the input compensation pulse and the delay cycle pulse so as to generate an AND gate cycle pulse; and
    an OR gate circuit for performing a logic operation of OR on the input compensation pulse and the delay cycle pulse so as to generate an OR gate cycle pulse.

7. The pulse duty cycle automatic correction device of claim 1, wherein the multiplexer generates the cycle pulse with the proportional duty cycle according to the output selection signal.

8. The pulse duty cycle automatic correction device of claim 1, wherein a detection time unit of the pulse width detector is equal to a delay time unit of the delay circuit.

9. An automatic correction method applied in a pulse duty cycle, the method comprising the following steps:
    obtaining a high level signal and a low level signal of an input cycle pulse according to a pulse width detector;
    obtaining a correction delay signal and an output selection signal by a comparator encoder;
    delaying a correction delay time so as to generate a delay cycle pulse according to the input cycle pulse;
    generating an input compensation pulse so as to compensate the input cycle pulse according to a compensation circuit;
    outputting an AND gate cycle pulse and an OR gate cycle pulse by simultaneously inputting the input compensation pulse and the delay cycle pulse into a logic circuit;
    selecting the AND gate cycle pulse, the OR gate cycle pulse or the input cycle pulse for output according to the output selection signal.

* * * * *